(12) United States Patent
Lee et al.

(10) Patent No.: US 8,817,223 B2
(45) Date of Patent: Aug. 26, 2014

(54) FLEXIBLE DISPLAY DEVICE AND FABRICATION METHOD THEREOF

(75) Inventors: Jae-Young Lee, Daejeon (KR); Jung-Hwan Lee, Daegu (KR)

(73) Assignee: LG Display Co., Ltd., Seoul (KR)

( * ) Notice: Subject to any disclaimer, the term of this patent is extended or adjusted under 35 U.S.C. 154(b) by 259 days.

(21) Appl. No.: 12/952,982

(22) Filed: Nov. 23, 2010

(65) Prior Publication Data

US 2011/0122559 A1 May 26, 2011

(30) Foreign Application Priority Data

Nov. 23, 2009 (KR) .......................... 10-2009-0113476

(51) Int. Cl.
*G02F 1/13* (2006.01)

(52) U.S. Cl.
USPC ............................... 349/187; 349/107; 445/24

(58) Field of Classification Search
CPC .... H01L 51/56; H01L 51/5203; G02F 1/1333
USPC .................................................. 349/107, 187
See application file for complete search history.

(56) References Cited

U.S. PATENT DOCUMENTS

| 7,345,729 B2 * | 3/2008 | Ohta et al. | 349/141 |
| 7,382,432 B2 * | 6/2008 | Yanagawa et al. | 349/153 |
| 7,894,008 B2 * | 2/2011 | You et al. | 349/38 |
| 2006/0027535 A1 * | 2/2006 | Furuya | 216/97 |
| 2008/0110862 A1 * | 5/2008 | Kim et al. | 216/83 |

(Continued)

FOREIGN PATENT DOCUMENTS

| JP | 2000-112399 | | 4/2000 | |
| JP | 2005-084228 | * | 3/2005 | ............ G02F 1/1333 |
| JP | 2009-230072 | | 10/2009 | |

OTHER PUBLICATIONS

Office Action issued in corresponding Korean Patent Application No. 10-2009-0113476, mailed Apr. 19, 2013.

(Continued)

*Primary Examiner* — Edward Glick
*Assistant Examiner* — Sang V Nguyen
(74) *Attorney, Agent, or Firm* — Brinks Gilson & Lione (57) ABSTRACT

Disclosed is a flexible display device capable of forming a display device on a glass substrate and simultaneously ensuring flexibility, and a fabrication method thereof, the method including preparing a glass substrate having a display region and a non-display region defined on a front surface thereof, forming a display device on the display region defined on the front surface of the glass substrate, preparing a metal foil substrate, bonding the metal foil substrate to the glass substrate such that a front surface of the metal foil substrate faces the front surface of the glass substrate so as to seal the display device, attaching a first passivation film on a region of a rear surface of the glass substrate, the region corresponding to a part or all of the non-display region defined on the front surface of the glass substrate, and attaching a second passivation film on an entire rear surface of the metal foil substrate, performing a first etching with respect to the display region of the rear surface of the glass substrate by using the first passivation film as a mask, removing the first passivation film, and performing a second etching with respect to the display region and the non-display region of the rear surface of the glass substrate, removing the second passivation film, and mounting a display device driving unit on the non-display region defined on the front surface of the glass substrate.

8 Claims, 5 Drawing Sheets

(56) References Cited

U.S. PATENT DOCUMENTS

2009/0015747 A1* 1/2009 Nishizawa et al. ............ 349/58
2009/0323009 A1* 12/2009 Paek et al. .................... 349/160

OTHER PUBLICATIONS

Office Action issued in corresponding Chinese Patent Application No. 201010621605.4, mailed Dec. 4, 2012.

* cited by examiner

FLEXIBLE DISPLAY DEVICE AND FABRICATION METHOD THEREOF

CROSS-REFERENCE TO RELATED APPLICATIONS

This application claims priority to Korean Patent Application No. 10-2009-0113476, filed Nov. 23, 2009. The aforementioned patent application is hereby incorporated by reference in its entirety.

BACKGROUND

1. Field of the Disclosure

The present disclosure relates to a flexible display device and a fabrication method thereof, and particularly, to a flexible display device capable of forming a display device on a glass substrate and simultaneously ensuring flexibility, and a fabrication method thereof.

2. Background of the Disclosure

Electronic display devices are is gradually playing a more significant role these days in today's information society, and various types of electronic display devices are widely used in industrial fields and in ordinary lives.

An electronic display device is usually used for a television, a computer monitor and the like. Among others, a cathode ray tube (CRT) display device, has the longest history and takes the top market share position but has many disadvantages, such as a heavy weight, a large size, a high power consumption and the like.

Consequently, recently, rapid improvement of semiconductor technologies has led to the development of new electronic display devices, namely, flat panel display devices, such as organic electroluminescent devices, liquid crystal display devices and the like. Such flat panel display devices can be designed to be light in weight and thin.

Recently, in addition to those attractive characteristics, such as light weight, thin thickness and the like, the flat panel display device is made flexible, which allows its transformation. Accordingly, researches on a flexible display device, which can be conveniently used at anytime in any place, are actively conducted.

A typical flexible display device according to the related art will be described with reference to the accompanying drawing.

Figure 1:
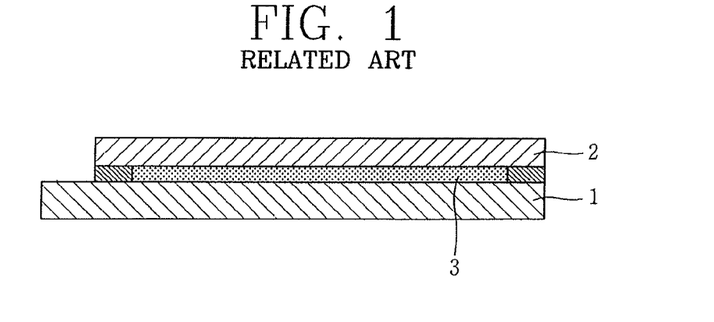
FIG. 1 is a sectional view showing a typical flexible display device according to the related art.

FIG. 1 is a sectional view of the typical flexible display device according to the related art.

As shown in FIG. 1, the related art flexible display device includes a first substrate 1, and a second substrate 2 disposed to face the first substrate 1 so as to seal a display device 3 on the first substrate 1. The first substrate 1 is made of plastic or metal foil, and the second substrate 2 is made of an inorganic material or plastic. The display device 3 is a flat panel display device, such as an organic electroluminescent device or a liquid crystal display device.

With the configuration of the related art flexible display device, if the first substrate 1 is made of plastic, the substrate is good in a light weight and also the plastic is the most suitable material for a roll-to-roll fabrication method. However, the plastic substrate may be in danger of being deformed due to heat during fabrication process. On the other hand, if the second substrate 2 is made of a metal foil, it is appropriate for installing a high functional display device and driving integrated circuits, but the flatness of its surface is worse than plastic or glass and wrinkles are easily generated on the substrate even when being slightly curved or bent.

SUMMARY

A flexible display device includes a glass substrate having a display region and a non-display region defined on a front surface thereof, the display region being thinner than the non-display region, a display device formed on the display region defined on the front surface of the glass substrate, a display device driving unit mounted on the non-display region defined on the front surface of the glass substrate, and a metal foil substrate bonded to correspond to the display region defined on the front surface of the glass substrate to seal the display device.

In accordance with one embodiment, there is provided a method for fabricating a flexible display device including preparing a glass substrate having a display region and a non-display region defined on a front surface thereof, forming a display device on the display region defined on the front surface of the glass substrate, preparing a metal foil substrate, bonding the metal foil substrate to the glass substrate such that a front surface of the metal foil substrate faces the front surface of the glass substrate so as to seal the display device, attaching a first passivation film on a region of a rear surface of the glass substrate, the region corresponding to a part or all of the non-display region defined on the front surface of the glass substrate, and attaching a second passivation film on an entire rear surface of the metal foil substrate, performing a first etching with respect to the display region of the rear surface of the glass substrate by using the first passivation film as a mask, removing the first passivation film, and performing a second etching with respect to the display region and the non-display region of the rear surface of the glass substrate, removing the second passivation film, and mounting a display device driving unit on the non-display region defined on the front surface of the glass substrate.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention.

In the drawings.

DETAILED DESCRIPTION OF THE EXEMPLARY EMBODIMENTS

Description will now be given in detail of a flexible display device and a fabrication method thereof in accordance with an exemplary embodiment, with reference to the accompanying drawings.

Hereinafter, a flexible display device according to an exemplary embodiment will be described with reference to FIGS. 2 to 6.

Figure 2:
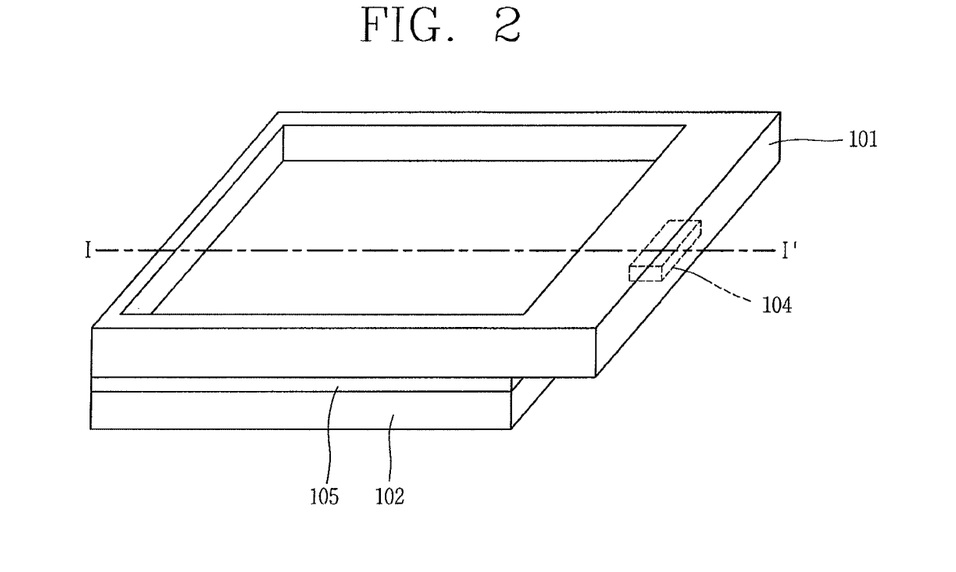
FIG. 2 is a perspective view showing a flexible display device in accordance with an exemplary embodiment.
Figure 3:
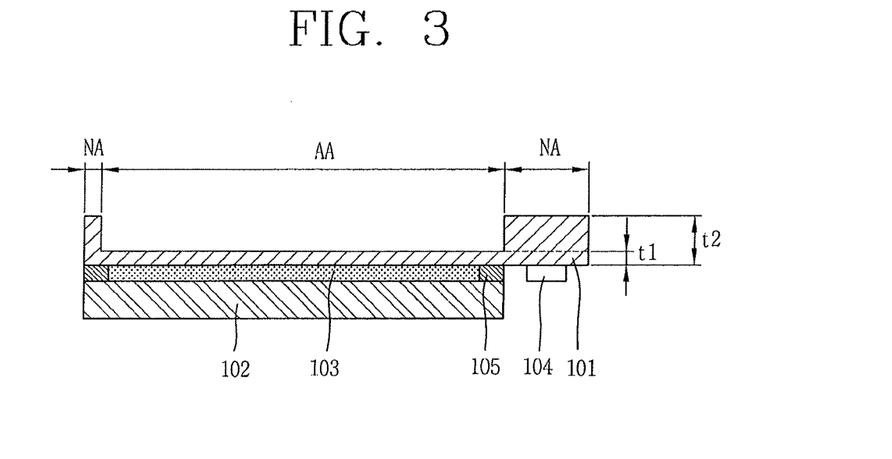
FIG. 3 is a sectional view taken along the line I-I' of FIG. 2.
Figure 4:
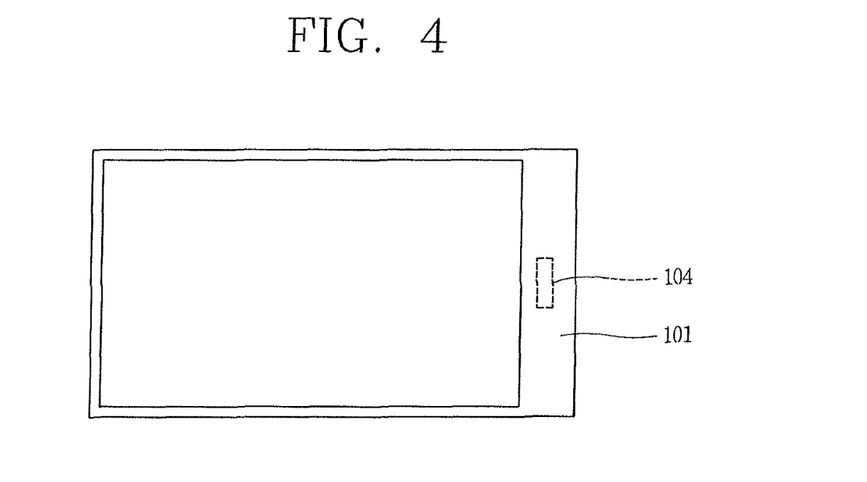
FIG. 4 is a top planar view of the flexible display device of FIG. 2.
Figure 5:
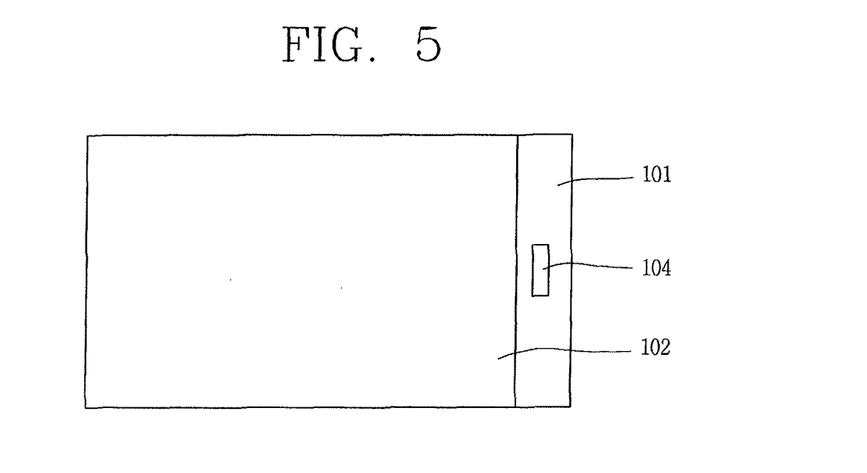
FIG. 5 is a bottom planar view of the flexible display device of FIG. 2.
Figure 6:
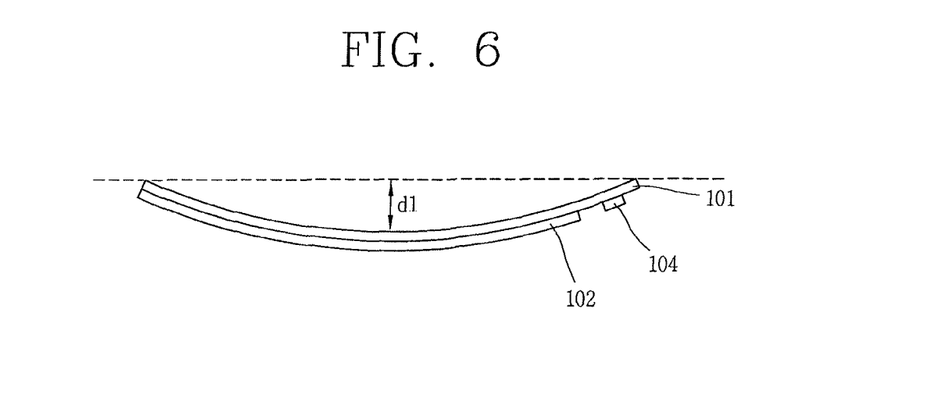
FIG. 6 is a side view showing a curved state of the flexible display device of FIG. 2.

FIG. 2 is a perspective view showing a flexible display device in accordance with an exemplary embodiment, FIG. 3 is a sectional view taken along the line I-I' of FIG. 2, FIG. 4 is a top planar view of the flexible display device of FIG. 2, FIG. 5 is a bottom planar view of the flexible display device of FIG. 2, and FIG. 6 is a side view showing a curved state of the flexible display device of FIG. 2.

Referring to FIGS. 2 to 5, a flexible display device according to an exemplary embodiment may include a glass substrate 101 having a display region AA and a non-display region NA defined on a front surface thereof, the display region AA being thinner than the non-display region NA, a display device 103 formed on the display region AA defined on the front surface of the glass substrate 101, a display device driving unit 104 formed on the non-display region NA defined on the front surface of the glass substrate 101, and a metal foil substrate 102 bonded to face the display region AA defined on the front surface of the glass substrate 101 so as to seal the display device 103.

Hereinafter, description will be given of each component of the flexible display device according to the exemplary embodiment with the configuration.

Referring to FIGS. 3 to 5, the flexible display device according to the exemplary embodiment may include the glass substrate 101 having the display device 103, and a metal foil substrate 102 facing the glass substrate 101.

The display region AA and the non-display region NA may be defined on the front surface of the glass substrate 101, and the display device 103 may be formed on the display region AA.

The glass substrate 101 may be configured such that the display region AA is thinner than the non-display region NA. In order to urge a panel curved, the display region AA of the glass substrate 101 may have a thickness in the range of about 0.03 mm to about 0.05 mm. Also, in order to avoid a damage on the glass substrate 101 upon mounting the display device driving unit 104 on the non-display region NA of the glass substrate 101, the non-display region NA may be more than about 0.2 mm in thickness. Here, the very thin thickness of the display region AA of the glass substrate 101 in the range of about 0.03 mm to about 0.05 mm and also the difference in thickness between the display region AA and the non-display region NA may result from an etching operation, which is performed two times onto the rear surface of the glass substrate 101 during the fabrication process. Such structure will be understood hereinafter by the description of a method for fabricating the flexible display device in accordance with an exemplary embodiment.

The display device 103 formed on the glass substrate 101 may be implemented in different variations without departing from the spirit or scope of the present disclosure. A representative example of the display device 103 may be an organic electroluminescent device.

The display device driving unit 104 for driving the display device 103 may be mounted on the non-display region NA of the glass substrate 101. The display device driving unit 104 may be fabricated in the form of an integrated circuit (IC).

The metal foil substrate 102 facing the glass substrate 101 may be bonded to the glass substrate 101 by use of an adhesive 105 or the like with facing the display region AA defined on the front surface of the glass substrate 101, so as to seal the display device 103, thereby protecting the display device 103 from humidity or the like.

Referring to FIG. 6, the panel formed by bonding the glass substrate 101 and the metal foil substrate 102 to each other may be allowed to be curved in a form that the glass substrate 101 is positioned inside and the metal foil substrate positioned outside when a force is applied to a central area of the rear surface of the glass substrate 101. In this case, a difference d1 in height between an end region and a central region of the metal foil substrate 102 may be in the range between 15 mm and 20 mm.

Hereinafter, description will be made of a method for fabricating the flexible display device in accordance with an exemplary embodiment with reference to FIGS. 7A to 7G and FIG. 3.

Figure 7A:
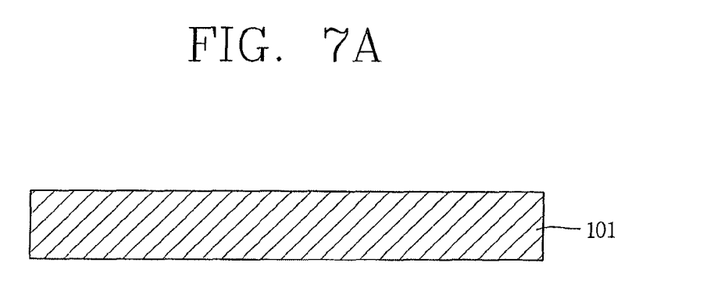
FIGS. 7A to 7G are sectional views sequentially showing a method for fabricating the flexible display device of FIG. 2.

First, referring to FIG. 7A, the glass substrate 101 having the display region AA and the non-display region NA on its surface is prepared.

Figure 7B:
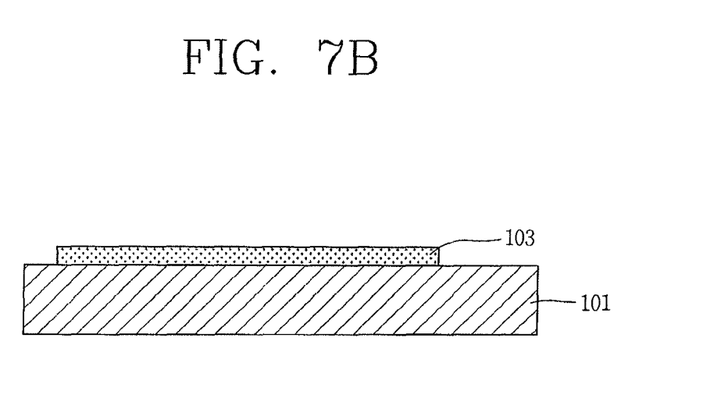

Referring to FIG. 7B, the display device 103 is formed on the display region AA defined on the front surface of the glass substrate 101.

Here, the display device 103 formed on the display region AA defined on the front surface of the glass substrate 101 may be implemented in different variations without departing from the spirit or scope of the present disclosure. A representative example of the display device 103 may be an organic electroluminescent device.

Figure 7C:
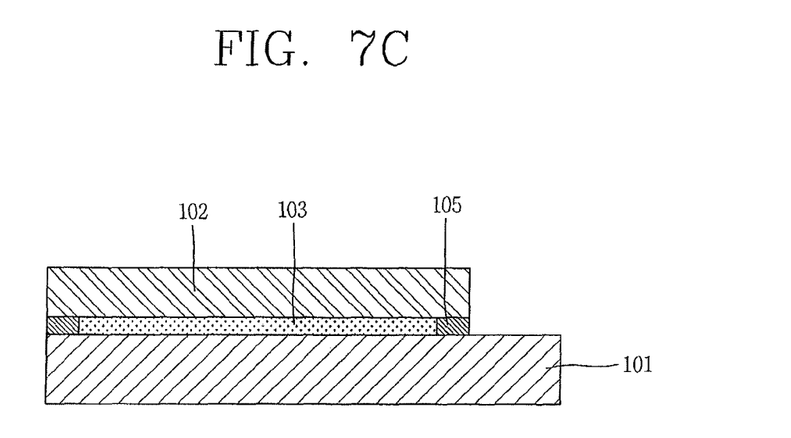

After preparing the metal foil substrate 102, referring to FIG. 7C, the metal foil substrate 102 is bonded to the glass substrate 101 such that the front surface of the metal foil substrate 102 faces the front surface of the glass substrate 101, thereby sealing the display device 103.

Here, a method for bonding the metal foil substrate 102 and the glass substrate 101 to each other may include bonding the two substrates by adding an adhesive 105 onto an edge of the display region AA of the glass substrate 101 on the region between the front surface of the metal foil substrate 102 and the front surface of the glass substrate 101.

Figure 7D:
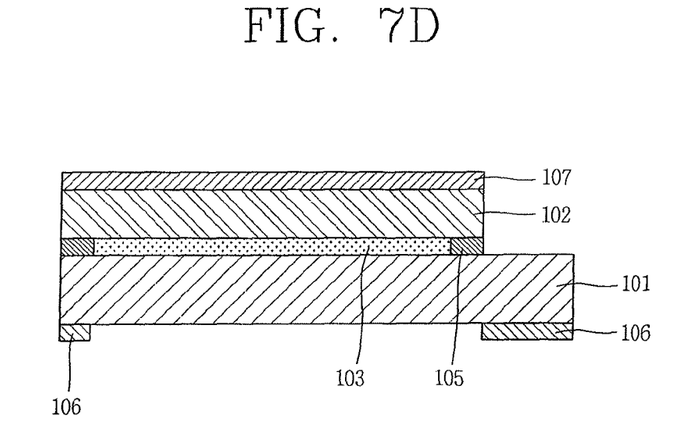
Figure 7E:
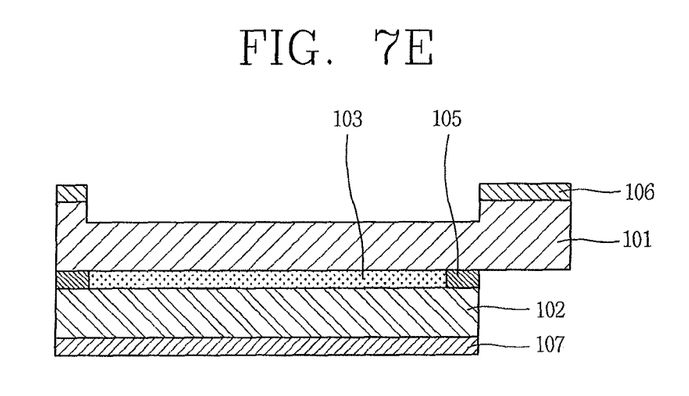

Referring to FIG. 7D, a first passivation film 106 is attached onto a region of the rear surface of the glass substrate 101, which corresponds to a part or all of the non-display region NA of the front surface of the glass substrate 101, and a second passivation film 107 is attached all over the rear surface of the metal foil substrate 102. Next, a first etching operation is performed with respect to the rear surface of the glass substrate 101 by using the first passivation film 106 as a mask, thereby removing the display region AA of the rear surface of the glass substrate 101 by a preset thickness, as shown in FIG. 7E. Here, a wet etching may be employed as an etching method. Among several types of wet etching methods, it may be appropriate to employ a wet etching method, in which a spray nozzle of an etching device is placed above the glass substrate 101 to spray an etching solution onto the rear surface of the glass substrate 101.

During the first etching operation, the metal foil substrate 102 is protected by the second passivation film 107.

Figure 7F:
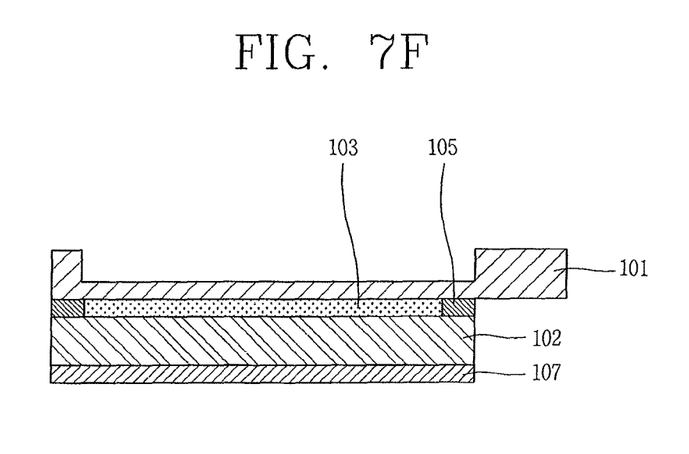

Afterwards, the first passivation film 106 attached onto the rear surface of the glass substrate 101 is removed and then a second etching is executed with respect to the rear surface of the glass substrate 101, thereby removing the display region AA and the non-display region NA of the rear surface of the glass substrate 101 by a preset thickness, as shown in FIG. 7F.

Consequently, in order to urge the glass substrate 101 curved after being bonded to the metal foil substrate 102, the display region AA of the glass substrate may have a thickness in the range of about 0.03 mm to about 0.05 mm.

Also, in order to avoid a damage on the glass substrate 101 upon mounting the display device driving unit 104 on the non-display region NA of the glass substrate 101, the non-display region NA of the glass substrate 101 may be more than about 0.2 mm in thickness.

That is, the second etching operation may be performed such that the display region AA of the glass substrate 101 has a thickness in the range of about 0.03 mm to about 0.05 mm and simultaneously the non-display region NA of the glass substrate 101 has a thickness more than about 0.2 mm.

During the second etching, the metal foil substrate 102 is protected by the second passivation film 107.

Figure 7G:
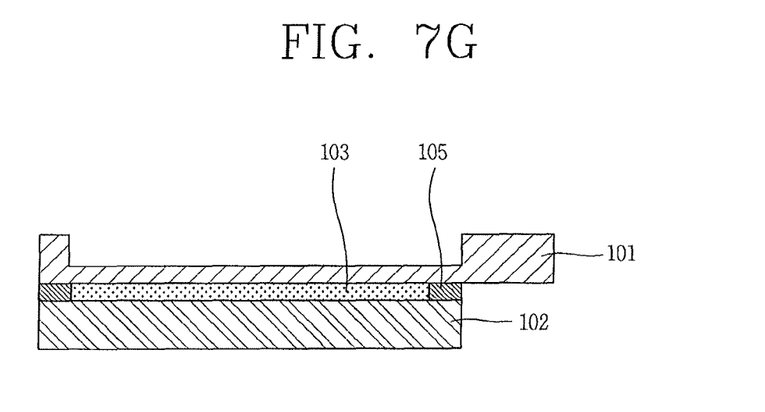

Referring to FIG. 7G, the second passivation film 107 attached onto the metal foil substrate 102 is removed, thereby mounting the display device driving unit 104 on the non-display region NA defined on the front surface of the glass substrate 101. Here, the display device driving unit 104 mounted on the non-display region NA of the glass substrate 101 may be fabricated in the form of an integrated circuit (IC).

In the description of the method for fabricating the flexible display device according to the exemplary embodiment, the glass substrate 101 and the metal foil substrate 102 are exemplarily described as a single substrate during the entire fabrication process, however, it is merely illustrative for the sake of explanation but not limited to this. Alternatively, the glass substrate 101 and the metal foil substrate 102 may be a mother substrate having a plurality of panel region defined thereon, and in this case, a process of cutting the glass substrate 101 into a panel region units prior to mounting the display device driving unit 104 on the non-display region NA of the glass substrate 101 may further be needed to be performed.

The foregoing embodiments and advantages are merely exemplary and are not to be construed as limiting the present disclosure. The present teachings can be readily applied to other types of apparatuses. This description is intended to be illustrative, and not to limit the scope of the claims. Many alternatives, modifications, and variations will be apparent to those skilled in the art. The features, structures, methods, and other characteristics of the exemplary embodiments described herein may be combined in various ways to obtain additional and/or alternative exemplary embodiments.

As the present features may be embodied in several forms without departing from the characteristics thereof, it should also be understood that the above-described embodiments are not limited by any of the details of the foregoing description, unless otherwise specified, but rather should be construed broadly within its scope as defined in the appended claims, and therefore all changes and modifications that fall within the metes and bounds of the claims, or equivalents of such metes and bounds are therefore intended to be embraced by the appended claims.

What is claimed is:

1. A method for fabricating a flexible display device comprising:
    preparing a glass substrate having a display region and a non-display region defined on a front surface thereof;
    forming a display device on the display region defined on the front surface of the glass substrate;
    preparing a metal foil substrate;
    bonding the metal foil substrate to the glass substrate such that a front surface of the metal foil substrate faces the front surface of the glass substrate so as to seal the display device to prevent moisture from being introduced into the display device, when the metal foil substrate is bonded to the glass substrate, the metal foil substrate does not overlap a portion of the non-display region on which a display device driving unit is to be disposed;
    attaching a first passivation film on a region of a flat rear surface of the glass substrate, the region corresponding to a part or all of the non-display region defined on the front surface of the glass substrate, and attaching a second passivation film on an entire rear surface of the metal foil substrate;
    performing a first etching on the flat rear surface of the glass substrate by using the first passivation film as a mask to reduce a thickness of the display region of the glass substrate without reducing a thickness of the non-display region of the glass substrate that is covered by the first passivation film, thereby forming a non-flat rear surface;
    removing the first passivation film, and performing a second etching on the entire non-flat rear surface of the glass substrate to reduce the thickness of the display region and the thickness of the non-display region to a predetermined thickness that allows the glass substrate to be curved after the metal foil substrate is bonded to the glass substrate;
    removing the second passivation film;
    mounting the display device driving unit on the non-display region defined on the front surface of the glass substrate; and
    the bonding the metal foil substrate is to bond the metal foil by forming an adhesive along edges of the display device.

2. The method of claim 1, wherein the second etching is performed such that the display region of the glass substrate has a thickness in the range of 0.03 mm to 0.05 mm.

3. The method of claim 1, wherein the second etching is performed such that the non-display region of the glass substrate is more than 0.2 mm in thickness.

4. The method of claim 1, wherein the display device driving unit is fabricated in the form of an integrated circuit.

5. A method for fabricating a flexible display device comprising:
    preparing a glass mother substrate having a plurality of panel regions defined on a front surface thereof, each panel region having a display region and a non-display region defined thereon;
    forming a display device on each display region defined on the front surface of the glass mother substrate;
    preparing a metal foil mother substrate;
    bonding the metal foil mother substrate to the glass mother substrate such that a front surface of the metal foil mother substrate faces the front surface of the glass mother substrate so as to seal the display devices to prevent moisture from being introduced into the display device, when the metal foil mother substrate is bonded to the glass mother substrate, the metal foil mother substrate does not overlap a portion of the non-display region on which a display device driving unit is to be disposed;
    attaching a first passivation film on a region of a flat rear surface of the glass mother substrate, the region corresponding to a part or all of each non-display region defined on the front surface of the glass mother substrate, and attaching a second passivation film on an entire rear surface of the metal foil mother substrate;
    performing a first etching on the flat rear surface of the glass mother substrate by using the first passivation film as a mask to reduce a thickness of the display region of the glass mother substrate without reducing a thickness of the non-display region of the glass mother substrate that is covered by the first passivation film, thereby forming a non-flat surface;
    removing the first passivation film, and performing a second etching on the entire non-flat rear surface of the glass mother substrate to reduce the thickness of the display region and the thickness of the non-display region to a predetermined thickness that allows the glass mother substrate to be curved after the metal foil mother substrate is bonded to the glass mother substrate;

removing the second passivation film;

cutting the bonded glass mother substrate and metal foil mother substrate into panel region units to form unit panels;

mounting the display device driving unit on a non-display region of each unit panel; and the bonding the metal foil substrate is to bond the metal foil by forming an adhesive along edges of the display device.

6. The method of claim 5, wherein the second etching is performed such that the display region of the glass mother substrate has a thickness in the range of 0.03 mm to 0.05 mm.

7. The method of claim 5, wherein the second etching is performed such that the non-display region of the glass mother substrate is more than 0.2 mm in thickness.

8. The method of claim 5, wherein the display device driving unit is fabricated in the form of an integrated circuit.

* * * * *